(12) United States Patent
Li et al.

(10) Patent No.: US 8,951,918 B2
(45) Date of Patent: Feb. 10, 2015

(54) METHOD FOR FABRICATING PATTERNED STRUCTURE OF SEMICONDUCTOR DEVICE

(71) Applicant: United Microelectronics Corp., Hsin-Chu (TW)

(72) Inventors: Chia-Jung Li, Tainan (TW); Chia-Jui Liang, Tainan (TW); Po-Chao Tsao, New Taipei (TW); Ching-Ling Lin, Kaohsiung (TW); En-Chiuan Liou, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/851,113

(22) Filed: Mar. 27, 2013

(65) Prior Publication Data

US 2014/0295650 A1    Oct. 2, 2014

(51) Int. Cl.
*H01L 21/311*    (2006.01)
*H01L 21/308*    (2006.01)

(52) U.S. Cl.
CPC ........ *H01L 21/308* (2013.01); *H01L 21/31144* (2013.01)
USPC ..................................................... 438/702

(58) Field of Classification Search
CPC ............ H01L 21/0337; H01L 21/0338; H01L 21/32139; H01L 27/10894
USPC ......... 438/702, 696, 699, 482, 692, 694, 700, 438/761
See application file for complete search history.

(56) References Cited

U.S. PATENT DOCUMENTS

| | | | |
|---|---|---|---|
| 6,955,961 B1 * | 10/2005 | Chung ........................ | 438/241 |
| 7,247,887 B2 | 7/2007 | King | |
| 8,138,010 B2 | 3/2012 | Scheuerlein | |
| 2007/0020565 A1 | 1/2007 | Koh | |
| 2007/0158756 A1 | 7/2007 | Dreeskornfeld | |
| 2007/0298616 A1 * | 12/2007 | Kim et al. ..................... | 438/700 |
| 2008/0248429 A1 | 10/2008 | Chou | |
| 2009/0233238 A1 | 9/2009 | Hsu | |
| 2009/0258499 A1 * | 10/2009 | Huang et al. .................. | 438/703 |
| 2009/0258500 A1 | 10/2009 | Yang | |
| 2010/0136790 A1 * | 6/2010 | Chang et al. .................. | 438/694 |
| 2011/0294075 A1 * | 12/2011 | Chen et al. .................... | 430/323 |
| 2012/0034781 A1 * | 2/2012 | Kuo .............................. | 438/694 |
| 2012/0044735 A1 * | 2/2012 | Tran et al. ...................... | 365/63 |

OTHER PUBLICATIONS

Su et al. (Journal of the Korean Physics Society, vol. 53, No. 2, pp. 579-583).*

* cited by examiner

*Primary Examiner* — Evan Pert
*Assistant Examiner* — Herve Assouman
(74) *Attorney, Agent, or Firm* — Winston Hsu; Scott Margo

(57) ABSTRACT

A method of fabricating a patterned structure of a semiconductor device is provided. First, a substrate having a first region and a second region is provided. A target layer, a hard mask layer and a first patterned mask layer are then sequentially formed on the substrate. A first etching process is performed by using the first patterned mask layer as an etch mask so that a patterned hard mask layer is therefore formed. Spacers are respectively formed on each sidewall of the patterned hard mask layer. Then, a second patterned mask layer is formed on the substrate. A second etching process is performed to etch the patterned hard mask layer in the second region. After the exposure of the spacers, the patterned hard mask layer is used as an etch mask and an exposed target layer is removed until the exposure of the corresponding substrate.

20 Claims, 8 Drawing Sheets

METHOD FOR FABRICATING PATTERNED STRUCTURE OF SEMICONDUCTOR DEVICE

BACKGROUND OF THE INVENTION

1. Field of the Invention

The present invention generally relates to the field of patterned structures, and more particularly, to a method for fabricating a patterned structure in a semiconductor device.

2. Description of the Prior Art

Integrated circuits (IC) are made of devices and interconnections, which are formed through patterned features in different layers. During the fabrication process of ICs, the photolithography is an essential technique. The photolithography is used to form designed patterns, such as implantation patterns or layout patterns, on at least a photomask, and then to precisely transfer such patterns to a photoresist layer by exposure and development steps. Finally, by performing several semiconductor processes such as etching process, ion implantation, deposition and so forth, complicated and sophisticated IC structures can be obtained.

With the continuous miniaturization of semiconductor devices and the remarkable advance in fabrication techniques of semiconductor devices, the conventional lithography process meets its limitation due to printability and manufacturability problems. To meet the requirements of device design rules which continue to push the resolution limits of existing processes and tooling, a double patterning technique (DPT) has been developed and taken as one of the most promising lithographic technologies for 32 nanometer (nm) node and 22 nm node patterning, since it can increase the half-pitch resolution up to twice higher by using current infrastructures. For example, the litho-etch-litho-etch (LELE) approach, also called 2P2E, is one of the most common DPTs for fabricating patterns in a semiconductor device. When a 2P2E approach is carried out, a target layer, such as a polysilicon layer, located on a substrate will first be covered with an etch mask in order to define regions for forming patterns. Then, a plurality of stripe patterned target layers, which are parallel to each other, are formed by performing the first litho-etch process. In this way, critical dimension (CD) is defined between two adjacent stripe patterned target layers. Finally, a second litho-etch process is performed in order to cut out or split a portion of the stripe patterned target layers. Through the preceding processes, structures with relatively high resolution can be obtained. However, there are still many drawbacks that need to be overcome. For example, the CD between two adjacent stripe patterned target layers is further enlarged during the second litho-etch process, which may lead to inevitable dimension variation. Since there is a strong link between CD and electrical properties of the semiconductor device, the CD in semiconductor devices should be well controlled so as to increase the performance and the reliability of the semiconductor device.

Accordingly, in order to overcome the above-mentioned drawbacks, there is a need to provide a modified method of fabricating a patterned structure with improved reliability.

SUMMARY OF THE INVENTION

One objective of the present invention is therefore to provide a method for fabricating a patterned structure which can overcome drawbacks such as the increase in a critical dimension during a subsequent etching process.

To address these and other objectives, according to one preferred embodiment of the present, a method of fabricating a patterned structure in a semiconductor device is provided and includes the following processes. First, a substrate having a first region and a second region is provided. A target layer, a hard mask layer and a first patterned mask layer are then sequentially formed on the substrate. A first etching process is performed by using the first patterned mask layer as an etch mask so that the hard mask layer in the first region can be etched and a patterned hard mask layer is formed. Subsequently, spacers are respectively formed on each sidewall of the patterned hard mask layer. Then, a second patterned mask layer is formed on the substrate and directly contacts with each spacer. A second etching process is performed by using the second patterned mask layer as an etch mask so that the patterned hard mask layer in the second region can be etched and the spacers are exposed. After the exposure of the spacers, the patterned hard mask layer is used as an etch mask to remove an exposed target layer until the exposure of the corresponding substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIG. 1 to FIG. 12 depict a series of schematic diagrams of a method of fabricating a patterned structure of a semiconductor device in accordance with one preferred embodiment of the invention, wherein:

FIG. 1 is a schematic diagram showing a substrate having a target layer, a first mask layer and a first patterned mask layer sequentially stacked thereon;

FIG. 2 is a schematic cross-sectional diagram taken along a line A-A' in FIG. 1;

FIG. 3 to FIG. 5 are schematic cross-sectional diagrams showing steps for fabricating spacers;

FIG. 6 to FIG. 9 are schematic diagrams showing steps of removing the patterned target layer in second regions;

FIG. 10 to FIG. 11 are schematic diagrams showing steps of forming trenches in the substrate; and FIG. 12 is schematic diagram showing a shallow trench isolation structure.

Figure 1:
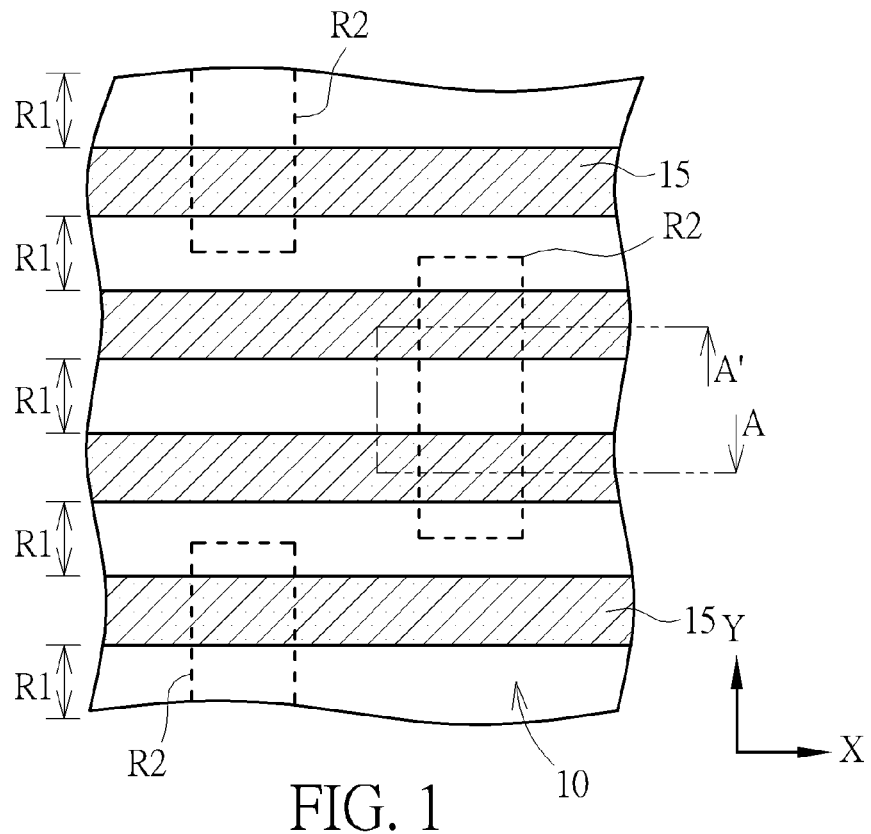

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 2:
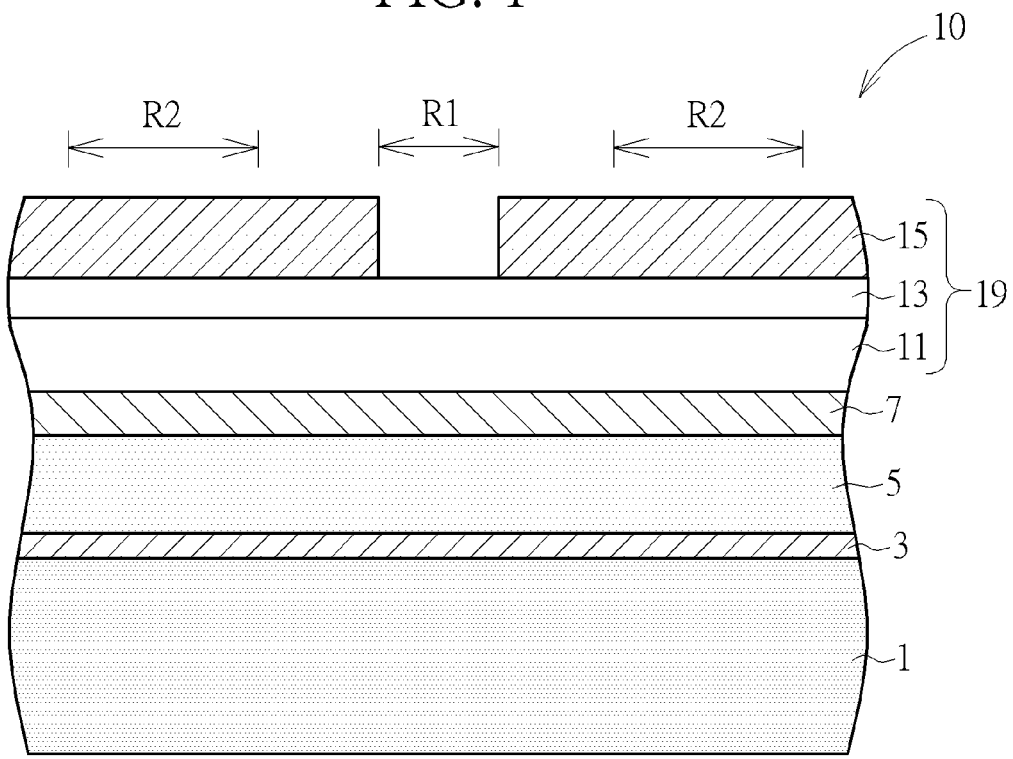

FIG. 1 to FIG. 12 depict a series of schematic diagrams of a method for fabricating a patterned structure of a semiconductor device in accordance with one preferred embodiment of the invention. Since the subject matter of the patterned structure is a shallow trench isolation structure according to this embodiment, the case of fabricating the shallow trench isolation structure through double patterning technique is described in the following paragraphs in detail. FIG. 1 is a cross-sectional diagram showing a structure at the beginning of the whole process. FIG. 2 is a schematic cross-sectional diagram taken along a line A-A' in FIG. 1. As shown in FIG. 1 and FIG. 2, a substrate 1 is first provided in this stage. A dielectric layer 3, a target layer 5, a hard mask layer 7 and a first patterned mask layer 19 are stacked on the substrate 1 from bottom to top. The substrate 1 is defined with at least a first region R1 and at least a second region R2. Preferably, the first regions R1 include a plurality of parallel regions extending along a first direction X, and the second regions R2 includes a plurality of alternately arranged regions (may be regarded as discontinuously arranged regions) extending along a second direction Y. There is a right angle between the first direction X and the second direction Y according to this embodiment, but not limited thereto. The angle may also range from 0 degree to 180 degrees. Accordingly, the first regions R1 may partially intersect and overlap the second regions R2. The first patterned mask layer 19 on the substrate 1 is preferably a multi-layered stack structure, such as a tri-layered stack structure including a bottom mask layer 11, a middle mask layer 13 and a top mask layer 15 from bottom to top, but not limited thereto. The number of layers may be increased or decreased if required. The first patterned mask layer 19 preferably has a first layout pattern 10 defined therein through a photolithographic process, but not limited thereto. It should be noted that the first layout pattern 10 is preferably designed according to the shape of the first regions R1 so that the top mask layer 15 originally disposed within the first regions R1 can be removed during a suitable photolithographic process. As a result, the top mask layer 15 with the stripe layout pattern is formed as shown in FIG. 1.

The above-mentioned substrate 1 is preferably a semiconductor substrate, such as silicon substrate, silicon germanium (SiGe) substrate, silicon-on-insulator (SOI) substrate or the likes. The dielectric layer 3 is an oxide layer, such as a pad layer, and the composition of which may be silicon dioxide or other suitable oxide, and may be formed through a thermal oxidation process, a high density plasma CVD (HPCVD) process or a sub-atmosphere CVD (SACVD) process, but not limited thereto. The target layer 5 is a nitride layer, such as silicon nitride pad layer, while the hard mask layer 7 is an oxide layer, such as silicon oxide layer. Besides, a bottom mask layer 11/a middle mask layer 13/a top mask layer 15 may respectively correspond to a bottom photoresist (PR) layer/an anti-reflective layer/a top photoresist layer, or respectively correspond to an amorphous carbon layer/an anti-reflective layer/a photoresist layer, but not limited thereto.

To put it more concretely, one case of the bottom photoresist layer/the anti-reflective layer/the top photoresist layer may be an ODL/a SHB layer/a 193 nm PR, wherein ODL is an abbreviation of organic dielectric layer, SHB is an abbreviation of silicon-containing hard-mask bottom anti-reflection coating, and 193 nm PR is a specific kind of photoresist that can be decomposed by a light source with a wavelength of 193 nanometers. The fabrication process for the bottom photoresist layer/the anti-reflective layer/the top photoresist layer may include the following steps. First, a bottom PR layer, like an ODL, is coated on the substrate and a baking procedure may further be performed optionally. Subsequently, an anti-reflective layer, such as an SHB, is formed. The composition of the SHB layer is organosilicon polymers or polysilane, which comprises at least a chromophore group, a crosslinkable group and a cross-linking agent. Finally, the top PR layer, such as 193 nm PR, is coated on the SHB layer. In this case, the top PR layer does not need to be very thick since the top PR layer mainly serves as a dry etch hard mask and the pattern defined therein only needs to be transferred from itself to the underlying SHB layer during the corresponding pattern transfer process. In another case, the composition of the amorphous carbon layer/the anti-reflective layer/the PR layer may respectively be an advanced patterning film (APF)/a SHB layer/a 193 nm PR. It should be noted that since the advanced patterning film (a type of amorphous carbon layer) has a high aspect ratio (HAR), a low line edge roughness (LER) and a PR-like ashability, it is widely used in advanced semiconductor processes.

Figure 3:
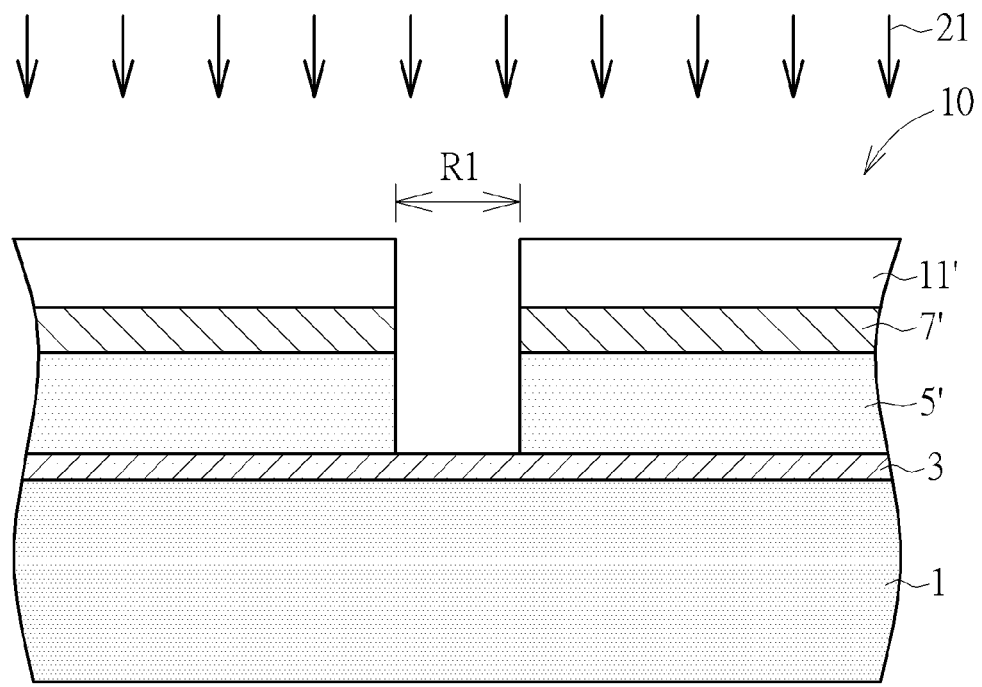

Please refer to FIG. 2 and FIG. 3. FIG. 3 is a schematic cross-sectional diagram showing a structure after a target layer in first regions is removed. In the case where the first patterned mask layer 19 covers the substrate 1, a first etching process 21 is carried out and the first patterned mask layer 19 serves as an etch mask. The first layout pattern 10 in the first patterned mask layer 19 may be transferred into the hard mask layer 7 through the first etching process 21 and therefore form a patterned hard mask layer 7'. Preferably, the first layout pattern 10 may be further transferred into the target layer 5 so that a structure with a patterned target layer 5' may be obtained and the dielectric layer 3 within the first regions R1 may be exposed from the patterned target layer 5'. This structure is depicted in FIG. 3. At this time, since the surface of the substrate 1 is covered by the dielectric layer 3, it will not be damaged by etchants provided in the first etching process 21. According to the present embodiment, after the first etching process 21 is completed, residues of the patterned bottom mask layer 11' is atop the patterned hard mask layer 7' as shown in FIG. 3, but not limited thereto. According to other embodiments, during the first etching process 21, the bottom mask layer 11 may have been removed completely upon the first layout pattern 10 is formed in the patterned hard mask layer 7'. In this case, the first layout pattern 10 may be further transferred into the target layer 5 by using the patterned hard mask layer 7' as an etch mask to form the patterned target layer 5'. Accordingly, the first etching process 21 is not restricted to only one etching recipe, it may also include more than one etching recipes in order to transfer the first layout pattern 10 under various etching conditions.

Figure 4:
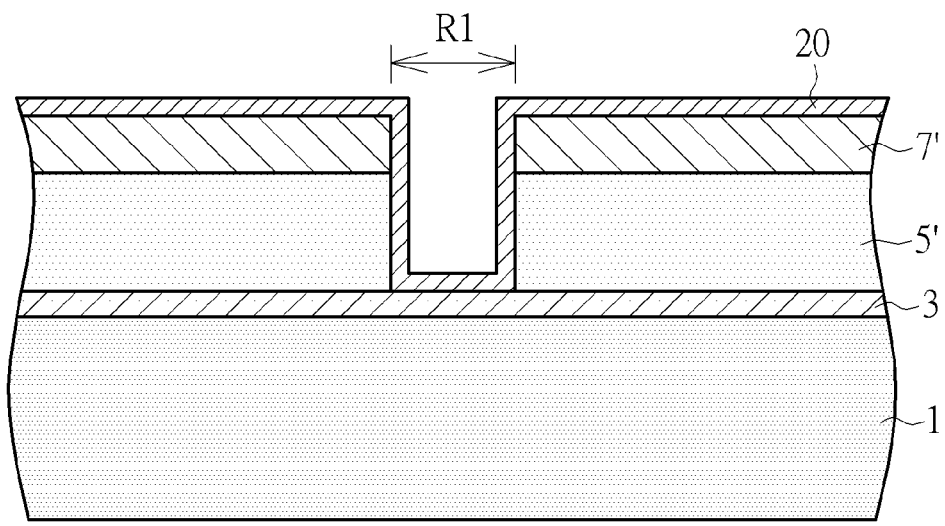
Figure 5:
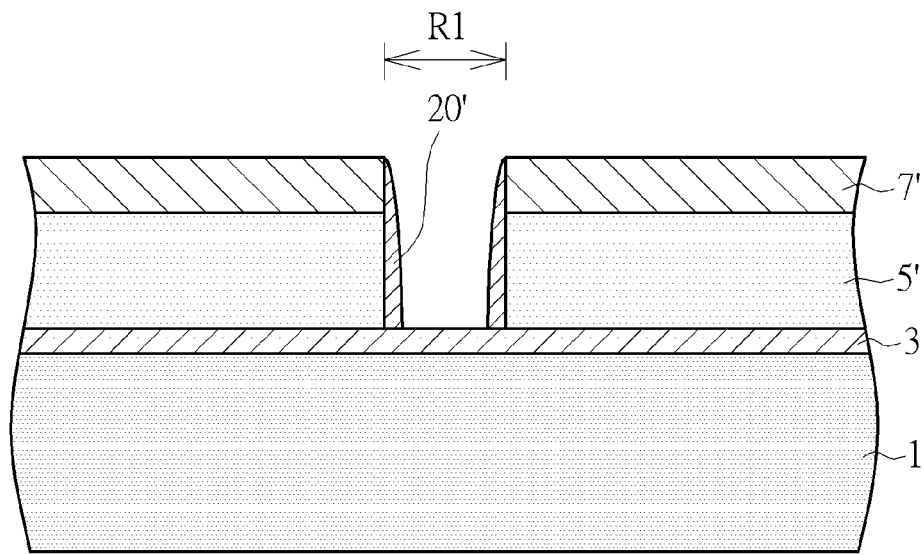

Then, please refer to FIG. 4 and FIG. 5. FIG. 4 and FIG. 5 are schematic cross-sectional diagrams showing steps for fabricating spacers. As shown in FIG. 4, after the patterned hard mask layer 7' is formed, a thin dielectric layer 20 with a uniform thickness is formed to conformally cover and to directly contact with the patterned hard mask layer 7', the patterned target layer 5', and the dielectric layer 3. The thin dielectric layer 20 is preferably thinner than the patterned hard mask layer 7'. Subsequently, an etching process is performed to remove the thin dielectric layer 20 right above the patterned hard mask layer 7' and the spacers 20' are then formed in the first region R. Each spacer 20' can expose portions of the dielectric layer 3 within the first region R1 and can cover each corresponding sidewall of the patterned hard mask layer 7'. Additionally, each spacer 20' can extend downwardly to further cover each corresponding sidewall of the patterned target layer 5'. The composition of the thin dielectric layer 20 may be nitride, oxide or oxynitride, and the composition of which can be the same as or different from that of the patterned hard mask layer 7'.

Figure 6:
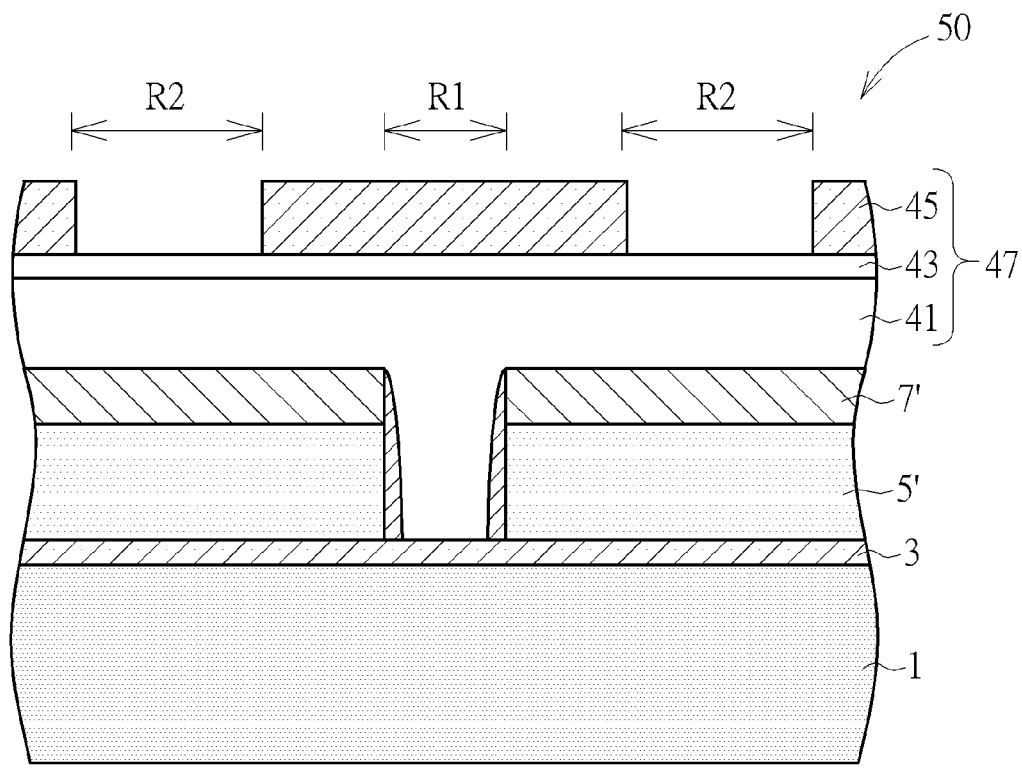

Afterward, please refer to FIG. 6 to FIG. 9. FIG. 6 to FIG. 9 are schematic diagrams showing steps of removing a patterned target layer in second regions. As shown in FIG. 6, a second patterned mask 47 is formed on the substrate 1 in order to completely cover the patterned hard mask layer 7' and spacers 20'. Similar to the first patterned mask layer, the second patterned mask layer 47 is preferably a multi-layered stack structure, such as a tri-layered stack structure including a bottom mask layer 41, a middle mask layer 43 and a top mask layer 45 from bottom to top, but not limited thereto. The number of layers may be increased or decreased if required. The first patterned mask layer 47 preferably has a second layout pattern 50 defined in the top mask layer 45 through a photolithographic process, but not limited thereto. According to the present embodiment, the extending direction of the first layout pattern 10 is orthogonal to that of the second layout pattern 50, but not limited thereto.

Figure 7:
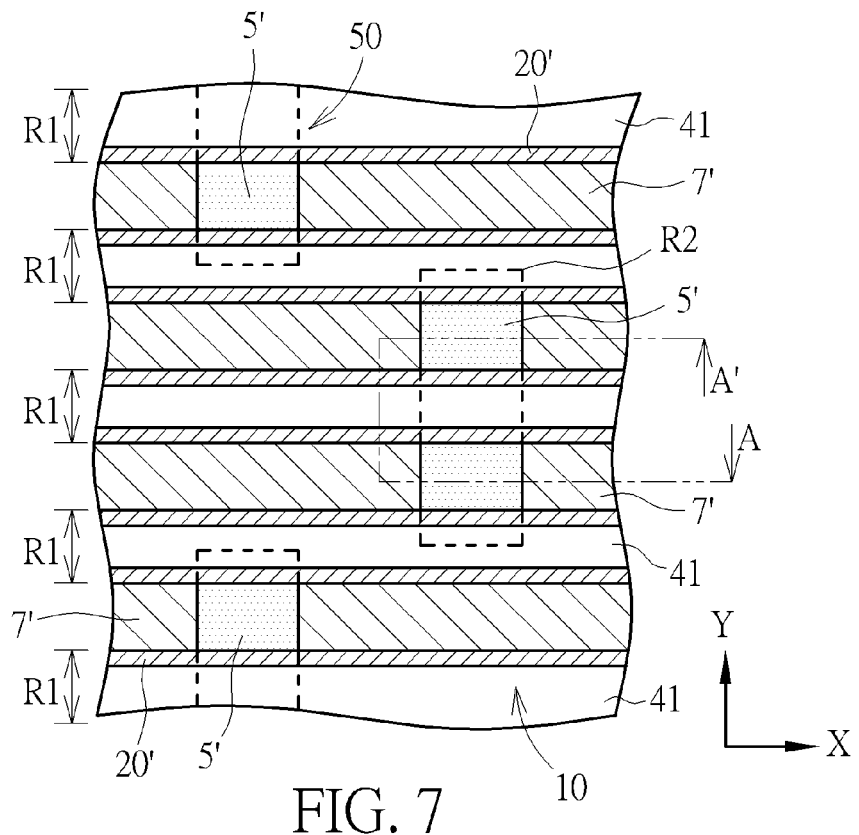
Figure 8:
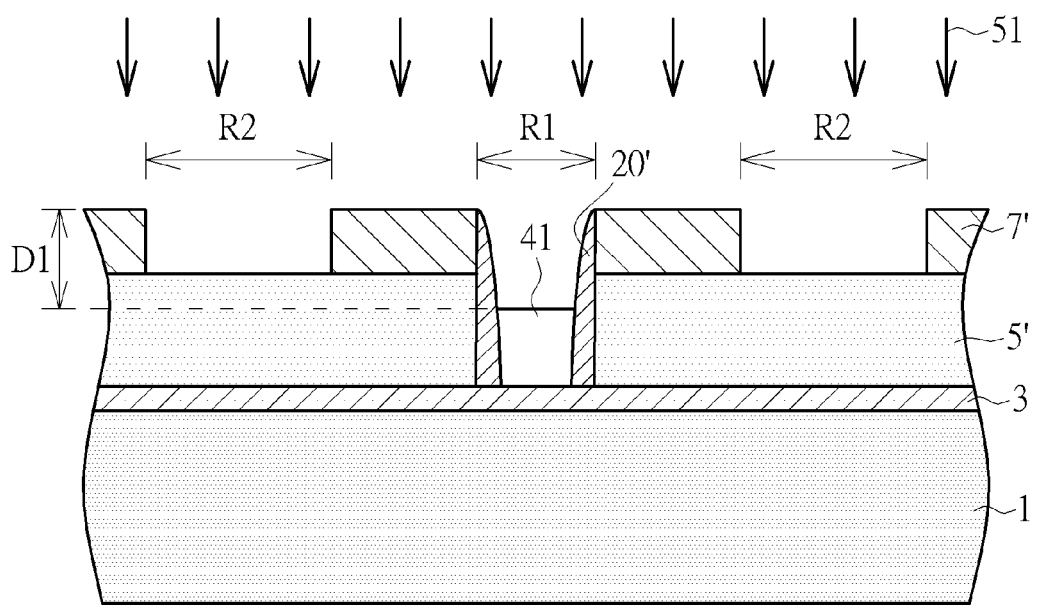

Please refer to FIG. 6 to FIG. 8. FIG. 8 is a schematic cross-sectional diagram taken along a line A-A' in FIG. 7. Subsequently, a second etching process 51 is carried out by using the second patterned mask layer 47 as an etch mask so that the second layout pattern 50 can be transferred to the patterned hard mask layer 7'. According to the present embodiment, since the etching recipes of the second etching process 51 can be modified in accordance with different fabrication requirements, the respective etching rate of the bottom mask layer 41, the middle mask layer 43 and the top mask layer 45 may be higher than that of the patterned hard mask layer 7'. Accordingly, when the second layout pattern 50 is transferred to the patterned hard mask layer 7', the bottom mask layer 41 in the first region R1 may be etched down to a first depth D1 and portions of each of the spacers 20' may be exposed from the bottom mask layer 41, but not limited thereto. According to other embodiments, the bottom mask layer 41 within the first region R1 may also be removed completely during the second etching process 51 and the dielectric layer 3 within the first region R1 is exposed accordingly. It should be noted that, according to this embodiment, the width of the first regions R1 is preferably shorter than that of the second regions R2, but not limited thereto. According to other embodiments, the width of the first region R1 may be wider than that of second regions R2.

Figure 9:
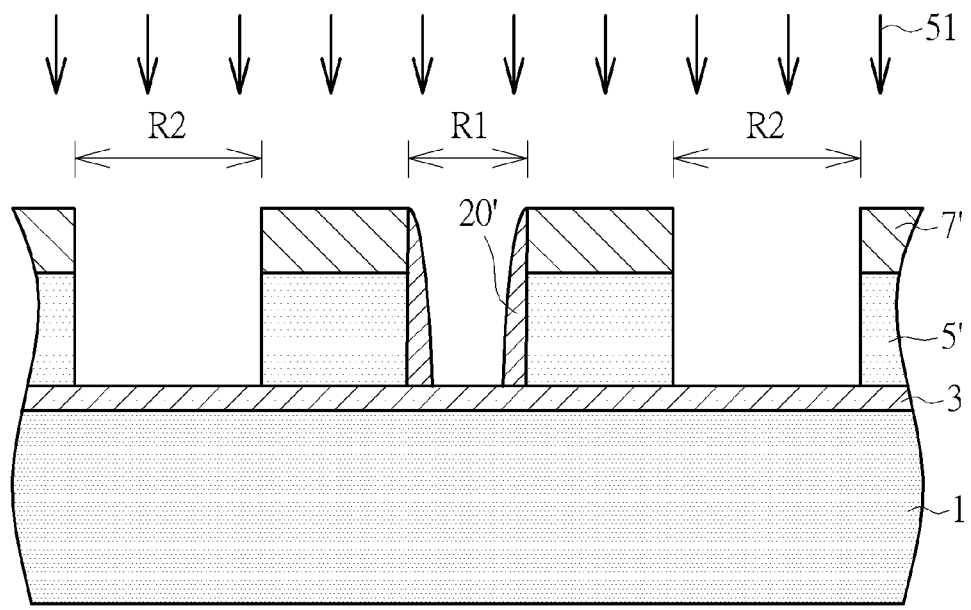

As shown in FIG. 9, a second etching process 51 is carried out subsequently by using the patterned hard mask layer 7' as an etch mask. The patterned target layer 5' can be etched until portions of the dielectric layer 3 are exposed. After the second etching process 51, the second layout pattern is accordingly transferred into the patterned target layer 5'. It should be noted that, since the sidewall of the patterned hard mask layer 7' and the sidewall of the patterned target layer 5' within the first region R1 are all covered by the spacers 20', the etchants will no longer damage the patterned hard mask layer 7' and the patterned target layer 5' within the first region R1 during the second etching process 51. In this way, the dimension originally defined between the opposite sidewalls of the patterned target layer 5' within the first region R1 can be kept at the same value before and after the second etching process 51. In other words, the spacers 20' are used to prevent the critical dimension defined in the first layout pattern within the first region R1 from been affected by the second etching process 51. According to this embodiment, the spacers 20' are preferably not etched by the second etching process 51. However, according to other embodiments, the spacer 20' may be etched during the second etching process 51 so that the thickness of the spacers 20' is further reduced or the patterned hard mask layer 7' originally covered by the spacers 20' is exposed eventually. However, even though the spacers 20' are etched away during the second etching process 51, they can prevent the patterned target layer 5' from being etched directly. In addition, according to the present embodiment, the second etching process 51 may include more than one etching recipes so that the etching recipe used to etch the patterned target layer 5' within the second regions R2 is different from the etching recipe used to etch the patterned hard mask layer 7' within the second regions R2.

Figure 10:
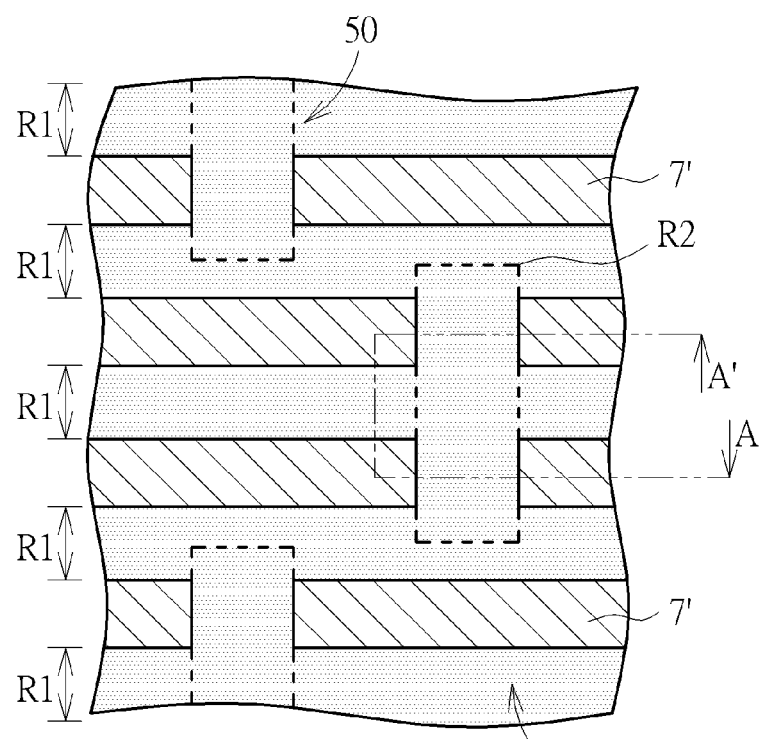
Figure 11:
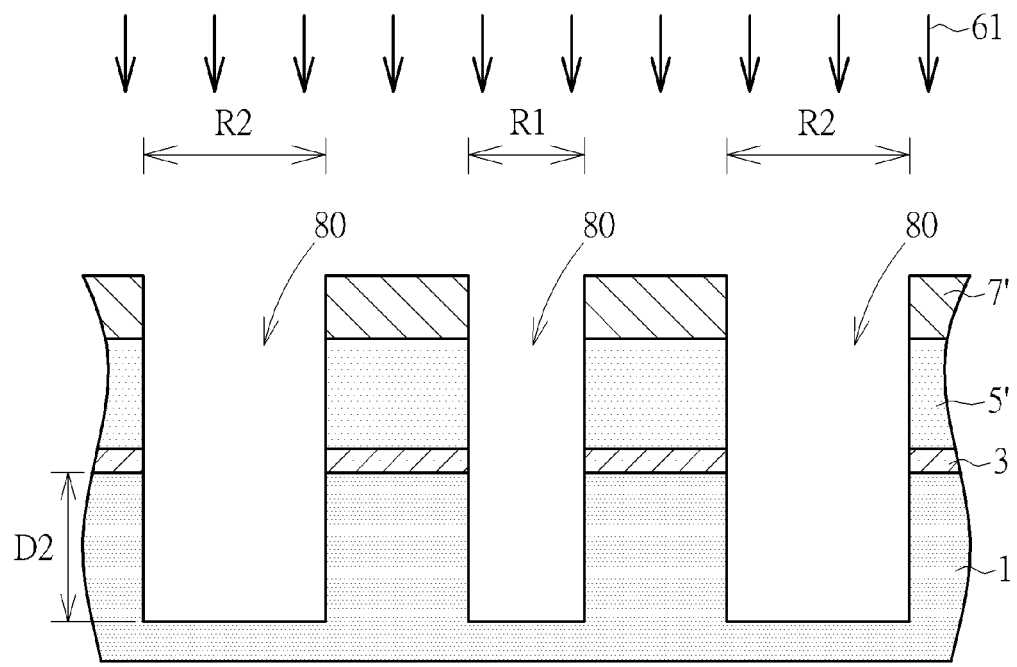
Figure 12:
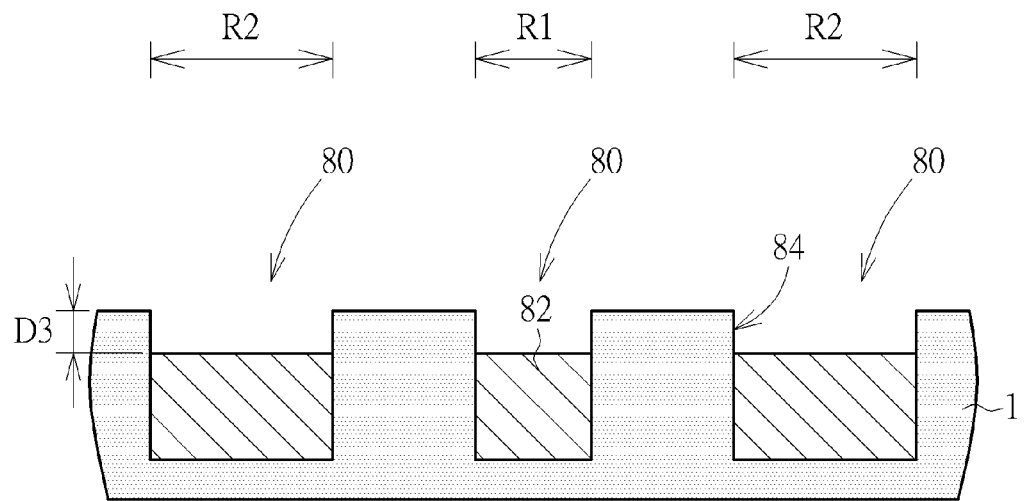

After the above-mentioned first etching process and second etching process, the first layout pattern and the second layout pattern are accordingly respectively defined in the patterned target layer 5'. Then, please refer to FIG. 10 to FIG. 12. FIG. 11 is a schematic cross-sectional diagram taken along a line A-A' in FIG. 10. As shown in FIG. 10 and FIG. 11, a third etching process 61 is carried out subsequently to etch through the dielectric layer 3 and form a plurality of trenches 80 with a second depth D2 in the substrate 1. At this time, the first layout pattern 10 and the second layout pattern 50 is transferred in the substrate 1. Afterward, the patterned hard mask layer 7' is removed to expose the surface of the patterned target layer 5'. A deposition process for forming an isolation layer, a planarization process and an etching back process are then carried out sequentially to form a structure as shown in FIG. 12. An isolation layer 82 with its surface in a third depth D3 is formed. Finally, the patterned target layer 5' and the dielectric layer 3 are removed completely to expose portions of the substrate 1. Now, a shallow trench isolation structure according to the present embodiment is obtained. Afterward, processes for implementing ion implantation, forming gate structures and fabricating conductive contact structures can be carried out. As a result, the substrate 1 protruding from the isolation layer 82 may act as fin structures 84 of multi-gate transistors.

In addition to the above-mentioned first preferred embodiment, the present invention also includes other modified embodiments for forming the shallow trench isolation structure. Since structures and fabrication process in these modified embodiments are substantially similar to those disclosed in the first preferred embodiment, the following paragraphs will focus on the main difference among these embodiments and similar features will usually be described with same reference numerals for ease of illustration and description thereof.

Figure 13:
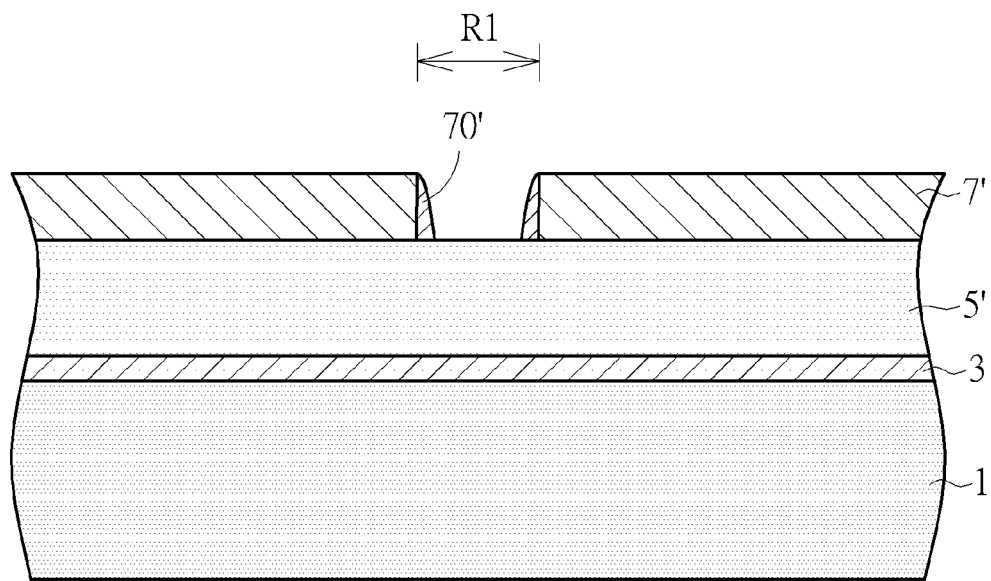
FIG. 13 to FIG. 14 are schematic diagrams showing a method of forming a patterned target layer according to one preferred embodiment of the present invention.
Figure 14:
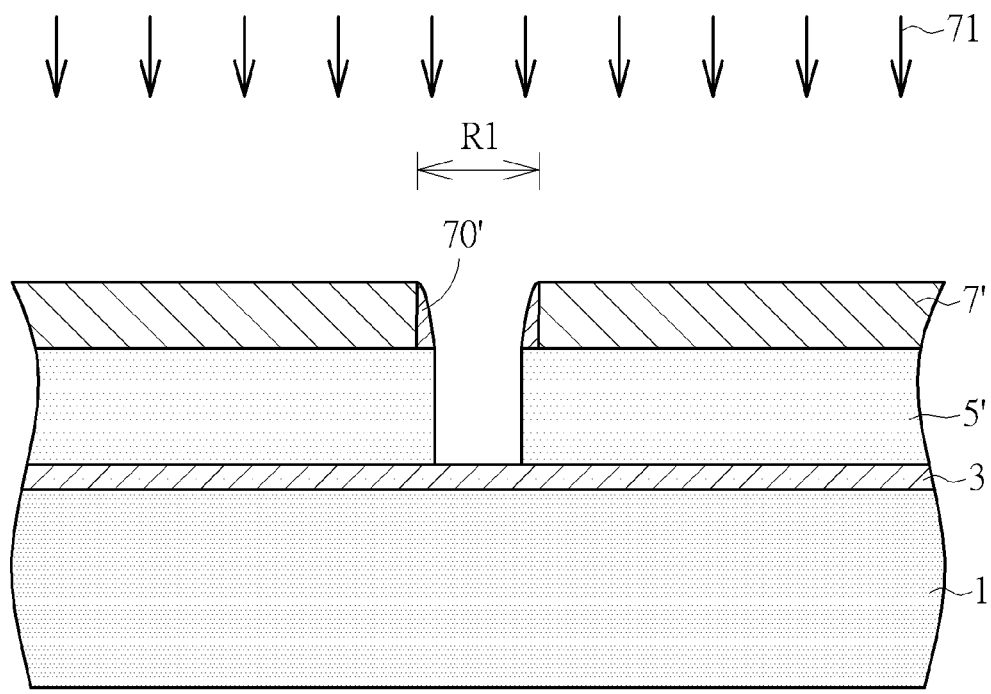

Please refer to FIG. 13 to FIG. 14. FIG. 13 to FIG. 14 are schematic diagrams showing a method for forming a patterned target layer according to one modified first preferred embodiment. The structures, and fabrication process and timing shown in FIG. 13 and FIG. 14 are corresponding to those shown in FIG. 3 to FIG. 5 of the first preferred embodiment. The main difference between these two embodiments is that, according to this modified first preferred embodiment, since the timing for forming spacers 70' shown in FIG. 13 is earlier than that for forming a patterned target layer, the spacers 70' may only cover the sidewall of the patterned hard mask layer 7'. Then, please refer to FIG. 14. After forming the spacers 70', an etching process 71 is carried out subsequently by using a patterned hard mask layer 7' and each spacer 70' as an etch mask. Accordingly, the target layer (not shown) within the first region R1 can be removed completely and a patterned target layer 5' is formed. At this time, the dimension between two opposite sidewalls of the patterned target layer 5' within the first region R1 is smaller than that originally defined by a first layout pattern. In the subsequent process for transferring a second layout pattern, the patterned target layer 5' right underneath each of the spacers 70' may act as an etching sacrificial layer, which is used to prevent the patterned target layer 5' right underneath the patterned hard mask layer 7' from being etched. Accordingly, even though each sidewall of the patterned target layer 5' within the first region R1 may be partially etched during transferring the second layout pattern, its dimension can be kept the same as or only slightly smaller than the critical dimension originally defined in the first layout pattern.

Figure 15:
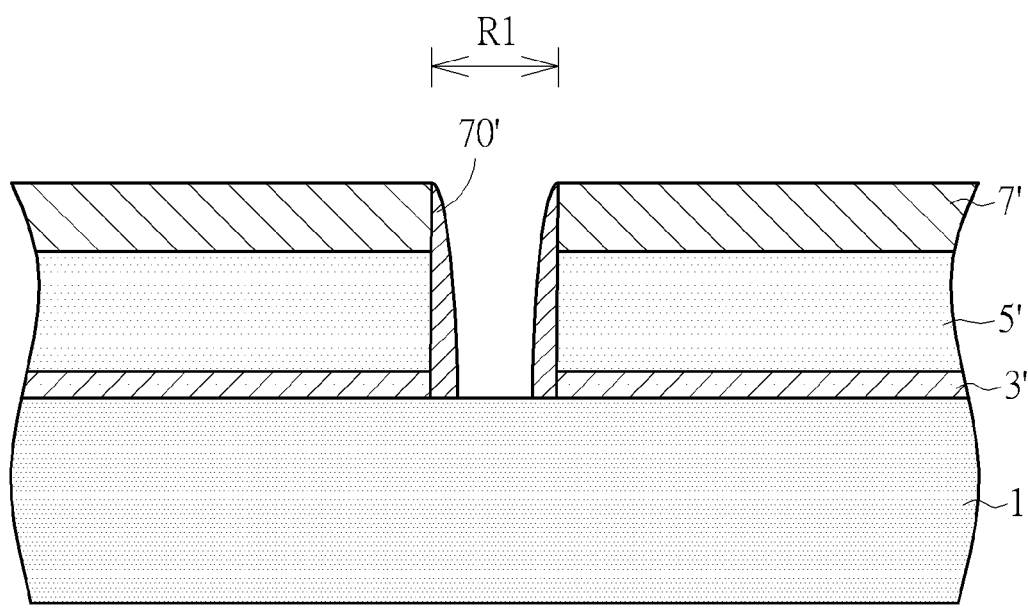
FIG. 15 is a schematic diagram showing a method for forming spacers according to one preferred embodiment of the present invention.

The present invention further includes another modified embodiment related to the first preferred embodiment. Please refer to FIG. 15. FIG. 15 is a schematic diagram showing a method of forming a patterned dielectric layer according to a modified preferred embodiment of the present invention. The structure, and fabrication process and timing shown in FIG. 15 is substantially corresponding to those shown in FIG. 5 of the first preferred embodiment. The main difference between these two embodiments is that, according to this modified first preferred embodiment, the first layout pattern is not only transferred to the hard mask layer and the target layer but also transferred to the dielectric layer. In this way, a patterned dielectric layer 3' is formed and the corresponding substrate 1 is exposed. Accordingly, the sidewall of the patterned dielectric layer 3' as well as the sidewall of the patterned hard mask layer 7' and of the patterned target layer 5' can all be covered by the spacers 70'.

It should be noted that, according to still another modified first preferred embodiment, there may be no dielectric layer disposed between a target layer and a substrate. In this configuration, after a target layer is etched through, a substrate in the corresponding region will be exposed and can be in direct contact with subsequently formed spacers. Apart from the lack of dielectric layer, the structures and fabrication processes according to this modified embodiment are all substantially similar to those shown in FIG. 1 to FIG. 15 according to the first preferred embodiment or the above-mentioned modified first preferred embodiment. For the sake of brevity, these similar configurations and fabrication processes are therefore not disclosed in detail.

According to the preceding paragraphs, a method for forming a patterned structure of a semiconductor device is used to form a shallow trench isolation structure. However, according to a second preferred embodiment of the present invention, the method can be used to form a gate pattern structure. Since structures and fabrication processes in the second preferred embodiment are substantially similar to those disclosed in the first preferred embodiment, the following paragraphs will focus on the main differences among these embodiments and similar features will usually be described with same reference numerals for ease of illustration and description thereof. Similar to the structures shown in FIG. 1 to FIG. 10 and FIG. 13 to FIG. 15, the main difference between this embodiment and the first preferred embodiment is that the target layer 5 according to the second preferred embodiment is a gate conductive layer, such as a single crystalline silicon layer, a polycrystalline silicon layer or an amorphous layer. The dielectric layer 3 is a gate oxide layer, such as silicon oxide layer. In addition, the composition of the spacers 20' may be the same as that of the target layer 5 according to this embodiment. In this way, since the spacers 20' may be removed concurrently during the process for transferring the second layout pattern to the patterned target layer 5', no additional etching process is required to remove the spacers 20'. Apart from no trench forming in the substrate 1, the layout pattern design according to this preferred embodiment is almost similar to that shown in FIG. 10. According to this preferred embodiment, the first layout pattern is used to define a side-by-side pitch between two adjacent gate structures, while the second layout pattern is used to define a head-to-head pitch between two adjacent gate structures. Similar to the structure shown FIG. 9, since the spacers 20' can cover the patterned target layer 5' within the first region R1, which prevents the original dimension defined by the first layout pattern from being enlarged during the transfer of the second layout pattern. It should be noted that the dielectric layer 3 according to the second preferred embodiment will be preferably etched through during the process for transferring the first layout pattern. Accordingly, the patterned dielectric layer 3' is formed and the corresponding substrate 1 can be exposed. Additionally, the second layout pattern may be first transferred to the target layer and the first layout pattern is transferred to the patterned target layer afterward if required.

In addition, for the sake of clarity, a double patterning technique is only applied for fabricating the shallow trench isolation structure and the gate pattern structure pattern in the preceding paragraphs. However, the present invention can also be applied to any semiconductor patterning process to form a well-patterned structure, such as interlayer dielectric (ILD) contact holes, ILD via holes or the likes.

To summarize, one feature of the present invention is that, before transferring a second layout pattern into a patterned target layer, spacers are formed to at least cover the sidewall of a patterned hard mask layer or to further cover the sidewall of a patterned target layer so as to protect a critical dimension defined by a first layout pattern. In the subsequent etching process, a second layout pattern can be transferred to the patterned target layer without enlarging the original dimension of the first layout pattern which is defined in the patterned hard mask layer or the patterned target layer. Accordingly, the CD in the semiconductor device can be well controlled and the performance and the reliability of the semiconductor device are improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating of a patterned structure of a semiconductor device, comprising:
    providing a substrate comprising a first region and a second region;
    sequentially forming a target layer, a hard mask layer and a first patterned mask layer on the substrate;
    performing a first etching process by using the first patterned mask layer as an etch mask, so as to etch the hard mask layer in the first region and form a patterned hard mask layer;
    respectively forming a spacer on each sidewall of the patterned hard mask layer;
    forming a second patterned mask layer on the substrate after the step of forming the spacers, wherein the second patterned mask layer directly contacts each of the spacers;
    performing a second etching process by using the second patterned mask layer as an etch mask, so as to etch the patterned hard mask layer in the second region and concurrently expose each of the spacers; and
    after exposing the spacers, removing the target layer by using the patterned hard mask layer as an etch mask until the substrate is exposed.

2. The method according to claim 1, wherein the first region intersects and partially overlaps the second region.

3. The method according to claim 1, wherein the first patterned mask layer or the second patterned mask layer is a multi-layered stack structure.

4. The method according to claim 3, wherein the multi-layered stack structure sequentially comprises a bottom photoresist layer, a silicon-containing anti-reflective layer and a top photoresist layer.

5. The method according to claim 3, wherein the multi-layered stack structure sequentially comprises an advanced patterning film (APF), an anti-reflective layer and a photoresist layer.

6. The method according to claim 1, wherein the first patterned mask layer comprises a first layout pattern, and the second patterned mask layer comprises a second layout pattern.

7. The method according to claim 6, wherein the first layout pattern is orthogonal to the second layout pattern.

8. The method according to claim 1, further comprising using the patterned hard mask layer as an etch mask during the first etching process so as to form a patterned target layer.

9. The method according to claim 8, further comprising exposing the substrate in the first region before forming each of the spacers.

10. The method according to claim 8, wherein each of the spacers covers each of the sidewalls of the patterned target layer.

11. The method according to claim 8, wherein steps of forming the spacers comprises:

forming a dielectric layer entirely after forming the patterned hard mask layer, so as to conformally cover the patterned hard mask layer and the patterned target layer; and etching the dielectric layer.

12. The method according to claim 1, further comprising using each of the spacers as an etch mask after exposing each of the spacers.

13. The method according to claim 1, further comprising removing each of the spacers.

14. The method according to claim 1, wherein a dielectric layer is disposed between the target layer and the substrate.

15. The method according to claim 14, further comprising using the patterned hard mask layer as an etch mask during performing the first etching process so as to form a patterned dielectric layer.

16. The method according to claim 14, wherein each of the spacers is in direct contact with the dielectric layer.

17. The method according to claim 14, wherein the target layer comprises a silicon nitride layer, and the dielectric layer comprises a silicon oxide layer.

18. The method according to claim 17, further comprising using the patterned hard mask layer as an etch mask to form a plurality of trenches in the substrate after exposing the substrate.

19. The method according to claim 18, further comprising filling an isolation layer into each of the trenches.

20. The method according to claim 1, wherein the target layer comprises a single crystalline silicon layer, a polycrystalline silicon layer and an amorphous silicon layer.

* * * * *